(12) United States Patent
Liu et al.

(10) Patent No.: US 7,956,619 B2
(45) Date of Patent: Jun. 7, 2011

(54) TESTING AN INDUCTIVE LOAD OF A DEVICE USING A MODULATED SIGNAL

(75) Inventors: Raymond Y. Liu, Monterey Park, CA (US); Estella C. Chung, West Hills, CA (US); Joon Lee, Santa Clarita, CA (US)

(73) Assignee: Woodward HRT, Inc., Santa Clarita, CA (US)

( * ) Notice: Subject to any disclaimer, the term of this patent is extended or adjusted under 35 U.S.C. 154(b) by 1041 days.

(21) Appl. No.: 11/809,332

(22) Filed: May 31, 2007

(65) Prior Publication Data

US 2010/0259274 A1     Oct. 14, 2010

(51) Int. Cl.
*G01R 31/06* (2006.01)
*G01R 31/08* (2006.01)
(52) U.S. Cl. .................................. 324/546; 324/522
(58) Field of Classification Search ............ 324/546, 324/522
See application file for complete search history.

(56) References Cited

U.S. PATENT DOCUMENTS

| | | | |
|---|---|---|---|
| 5,384,539 A * | 1/1995 | Morbe et al. ............ | 324/527 |
| 5,532,601 A | 7/1996 | Weir et al. | |
| 5,552,712 A | 9/1996 | Weir et al. | |
| 5,914,830 A | 6/1999 | Kadlec et al. | |
| 6,076,391 A | 6/2000 | Broch | |
| 6,822,560 B2 | 11/2004 | Geber et al. | |

* cited by examiner

*Primary Examiner* — Amy He
(74) *Attorney, Agent, or Firm* — BainwoodHuang

(57) ABSTRACT

A device has built-in inductive load testing capabilities. The device includes a device housing, an inductive load disposed within the device housing; and test circuitry disposed within the device housing. The test circuitry is constructed and arranged to effectuate application of a modulated test signal to the inductive load, and obtain a result signal in response to the application of the modulated test signal to the inductive load. The test circuitry is further constructed and arranged to generate an output signal indicating that the inductive load is in one of (i) a shorted inductive load state, (ii) a normal inductive load state, and (iii) an abnormally high inductive load state, based on the result signal. Such test circuitry is well-suited for testing a variety of devices having inductors/coils which are susceptible to defects (e.g., a solenoid, a motor winding, various actuator components, etc.).

20 Claims, 7 Drawing Sheets

TESTING AN INDUCTIVE LOAD OF A DEVICE USING A MODULATED SIGNAL

BACKGROUND

A typical guided bomb includes movable fins which control the direction of the bomb's trajectory. In particular, motors which are attached to the movable fins turn the fins in various directions thus enabling the bomb to change direction while passing through a particular medium (e.g., air, water, combinations thereof, etc.).

Just prior to launch of the guided bomb, a launcher typically tests the coils within the motors that control the movable fins. In particular, the launcher directs a circuit to check each motor coil for continuity by connecting one end of that motor coil to a reference point, and connecting the other end of that motor coil to a direct current (DC) voltage source. If the circuit senses current flow through the coil, the circuit concludes that there is proper continuity between the coil and the reference point, and deems the coil to be properly installed and in good condition. However, if the circuit senses no current flow, the circuit concludes that a defect exists (e.g., the coil is not properly connected to the reference point, there is a break in the coil, etc.). Upon detection of such a defect, the circuit prevents launching of the bomb and provides an error signal.

Since the circuit prevents the bomb from launching, the bomb will not be released in a manner that could inadvertently damage or destroy an unintended target. Additionally, the bomb, which could be relatively expensive, will remain available for de-bugging and possible salvaging thus enabling convenient defect identification and cost savings.

SUMMARY

Unfortunately, there are drawbacks to the above-identified conventional approach to continuity testing motor coils that control movable fins of a bomb. For example, such continuity testing will not detect a shorted motor coil, i.e., an unintended current pathway within the coil that bypasses a significant portion of the coil. Rather, since current will flow from the DC voltage source to the reference point either through the coil or through the unintended pathway, both (i) a properly connected and operating coil and (ii) an improperly connected or defective coil having a short will pass the continuity test. Specifically, in either situation, current passes to the reference point thus causing the test circuit to deem the coil to be properly installed and in good condition. Nevertheless, current passing through the shorted coil or an improperly installed coil will not generate a correct electromagnetic field for normal motor operation. Accordingly, the motor may not be able to control the path of the bomb correctly.

Similarly, such continuity testing may not detect a motor that possesses a high inductance defect, e.g., an improperly manufactured coil, an improperly installed motor, etc. Rather, since current may still flow from the DC voltage source to the reference point, the motor may pass the continuity test but nevertheless fail to properly control the bomb after launch.

In contrast to the above-described conventional approach to continuity testing motor coils which control movable fins of a bomb, an improved test technique involves testing an inductive load of a device using a modulated signal (e.g. an alternating current applied to the inductive load). The improved test technique is capable of identifying deviations in the inductive load from a nominal value (i.e., short, higher or lower inductance). As a result, the improved test technique is capable of detecting the existence of a defective coil or an improper coil installation that would go undetected under a conventional continuity test.

One embodiment is directed to a device (e.g., a guidable projectile) with built-in inductive load testing capabilities. The device includes a device housing, an inductive load disposed within the device housing; and test circuitry disposed within the device housing. The test circuitry is constructed and arranged to effectuate application of a modulated test signal to the inductive load, and obtain a result signal in response to the application of the modulated test signal to the inductive load. The test circuitry is further constructed and arranged to generate an output signal indicating that the inductive load is in one of (i) a shorted inductive load state, (ii) a normal inductive load state, and (iii) an abnormally high inductive load state, based on the result signal. Such test circuitry is well-suited for testing a variety of devices having inductors/coils which are susceptible to defects (e.g., a solenoid, a motor winding, various actuator components, etc.).

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

An improved test technique involves testing an inductive load of a device using a pulse width modulated signal (e.g. an alternating current applied to the inductive load). Accordingly, the improved test technique is capable of identifying deviations of the inductive load from a nominal value (i.e., short, higher or lower inductance). Thus, the improved test technique is capable of detecting the existence of a defective coil or an improper coil installation that would go undetected under a conventional continuity test.

Figure 1:
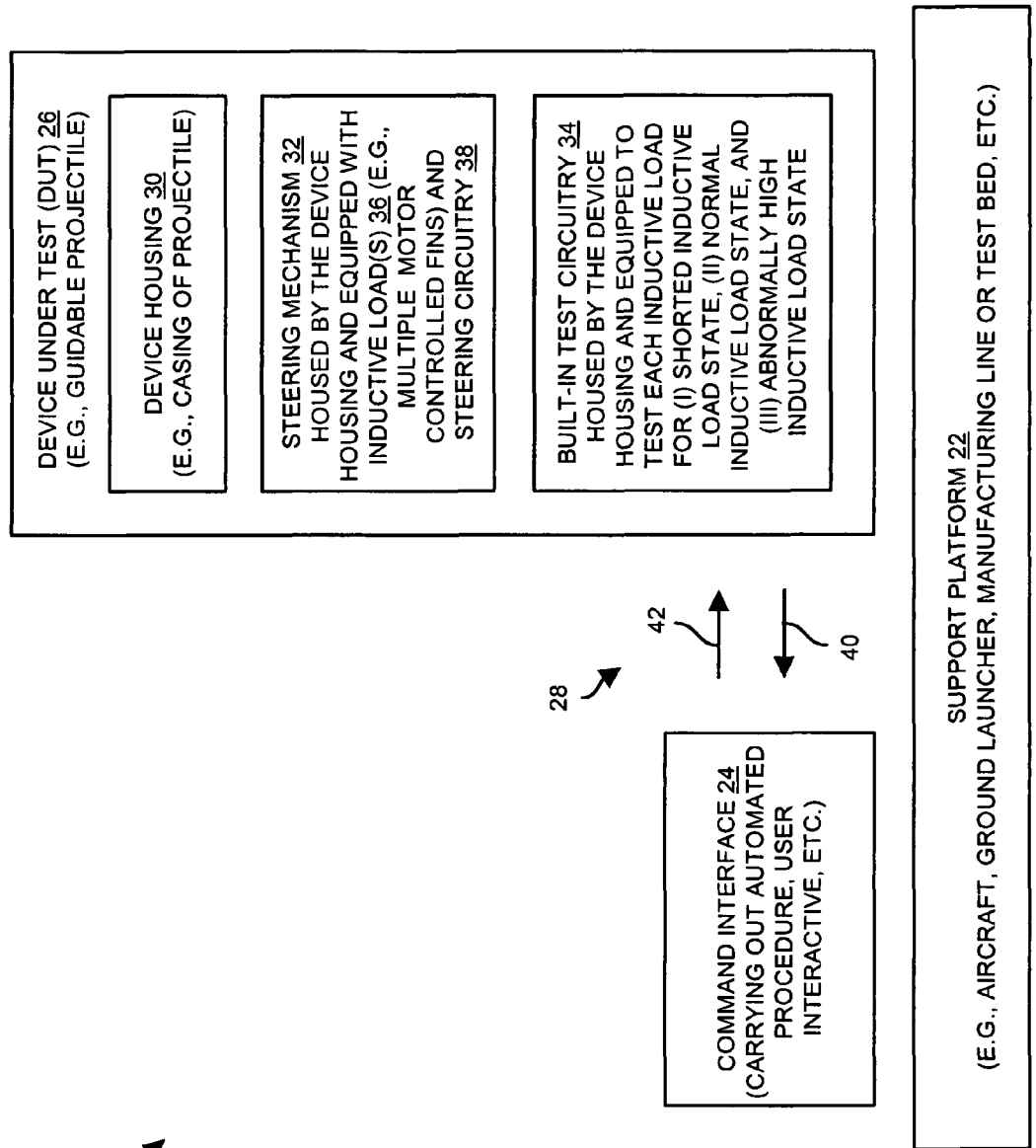
FIG. 1 is a block diagram of an operating environment which is suitable for a guidable projectile deployment system and which tests an inductive load of a guidable projectile using a modulated signal.

FIG. 1 shows an operating environment 20 for testing an inductive load of a device using a modulated signal. The operating environment 20 includes a support platform 22, a command interface 24 and a device under test (DUT) 26. The support platform 22 is constructed and arranged to support both the command interface 24 and the device under test 26. The command interface 24 is constructed and arranged to electronically access the DUT 26. For example, the command interface 24 is capable of exchanging electronic signals 28 with the DUT in an automated manner such as by carrying out an automated or scripted procedure. Alternatively, the command interface 24 is capable of exchanging the electronic signals 28 with the DUT 26 dynamically under direction of a user.

The device under test 26 includes a device housing 30, a steering mechanism 32, and built-in test circuitry 34. The steering mechanism 32 includes, among other things, (i) a set of inductive loads 36 (i.e., one or more inductive loads) and (ii) steering circuitry 38 which, during normal operation of the steering mechanism 32, is electrically coupled to the set of inductive loads 36. The built-in test circuitry 34, the set of inductive loads 36 and the steering circuitry 38 are housed within the device housing 30 for protective purposes.

During operation of the operating environment 20, the command interface 24 provides a test command 40 (e.g., an analog signal, a digital signal, a wireless signal, a packetized or framed network message, combinations thereof, etc.) to the DUT 26. The test command 40 directs the built-in test circuitry 34 within the device housing 30 to carry out a test on the set of inductive loads 36 within the device housing 30.

In response to the test command 40 from the command interface 24, the built-in test circuitry 34 housed within the device housing 30 properly connects the set of inductive loads 36 in a manner ready for testing (e.g., the test circuitry 34 isolates the set of inductive loads 36 from the steering circuitry 38) and performs testing on the set of inductive loads 36. As will be explained in further detail shortly, the built-in test circuitry 34 is capable of identifying whether an inductive load 36 is in (i) a shorted inductive load state, (ii) a normal inductive load state, or (iii) an abnormally high inductive load state, using a modulated signal.

Upon completion of the test, the built-in test circuitry 34 provides a response signal 42 (e.g., an analog signal, a digital signal, a wireless signal, a packetized or framed network message, combinations thereof, etc.) back to the command interface 24. The response signal 42 indicates the results of the test carried out by the built-in test circuitry 34. If there is an inductive load 36 which did not pass the test, the command interface 24 is capable of carrying out a variety of follow-up procedures (e.g., repeating the test, performing one or more additional tests, diagnosing the defect, signaling the user for assistance, etc.), as well as preventing deployment of the DUT 26. Such additional communications are represented generally by the arrow 28 in FIG. 1.

In some arrangements, the built-in test circuitry 34 is constructed and arranged to test multiple inductive loads 36. For example, in one arrangement, the built-in test circuitry 34 carries out individual testing of the inductive loads 36 one at a time. Such testing enables the built-in test circuitry 34 to precisely identify a particular inductive load 36 which does not pass the test.

In another arrangement, the built-in test circuitry 34 connects the inductive loads 26 together into a single aggregated circuit, and carries out testing of the aggregated circuit all at once for faster testing. In this arrangement, if an inductive load defect is discovered, the built-in test circuitry 34 is capable of carrying out other tests to diagnose the defect, e.g., following-up the test of the aggregated circuit with individual testing of the inductive loads 36 one at a time.

In yet another arrangement, the built-in test circuitry 34 includes a respective test circuit for each inductive load 36, and multiple test circuits carry out tests of multiple inductive loads substantially simultaneously. This arrangement provides fast testing as well as the ability to precisely identify a defective inductive load 36 among multiple inductive loads 36.

It should be understood that the above-described operating environment 20 is particularly well-suited for a guidable projectile deployment system which launches guidable projectiles (e.g., steerable rockets, guided missiles, torpedoes, and the like). In this context, the DUT 26 is a guidable projectile, and the steering mechanism 32 controls the direction of the guidable projectile during flight, i.e., while on its course through the air or through water after deployment of the guidable projectile. Here, the inductive loads 36 are typically inductive coils which are involved deployment and/or trajectory control, e.g., motor windings which control fin movement, solenoids which control fin unlocking or release from locked position(s), actuators involved release of the guidable projectile or movement of other portions of the guidable projectile, and so on.

In some situations, the support platform 22 is a movable vehicle (e.g., an aircraft, a watercraft, a land vehicle, etc.) ready to deploy a guidable weapon. In other situations, the support platform 22 is stationary (e.g., a fixed launch area, a facility for manufacturing guidable projectiles, etc.). Further details will now be provided with reference to FIG. 2.

Figure 2:
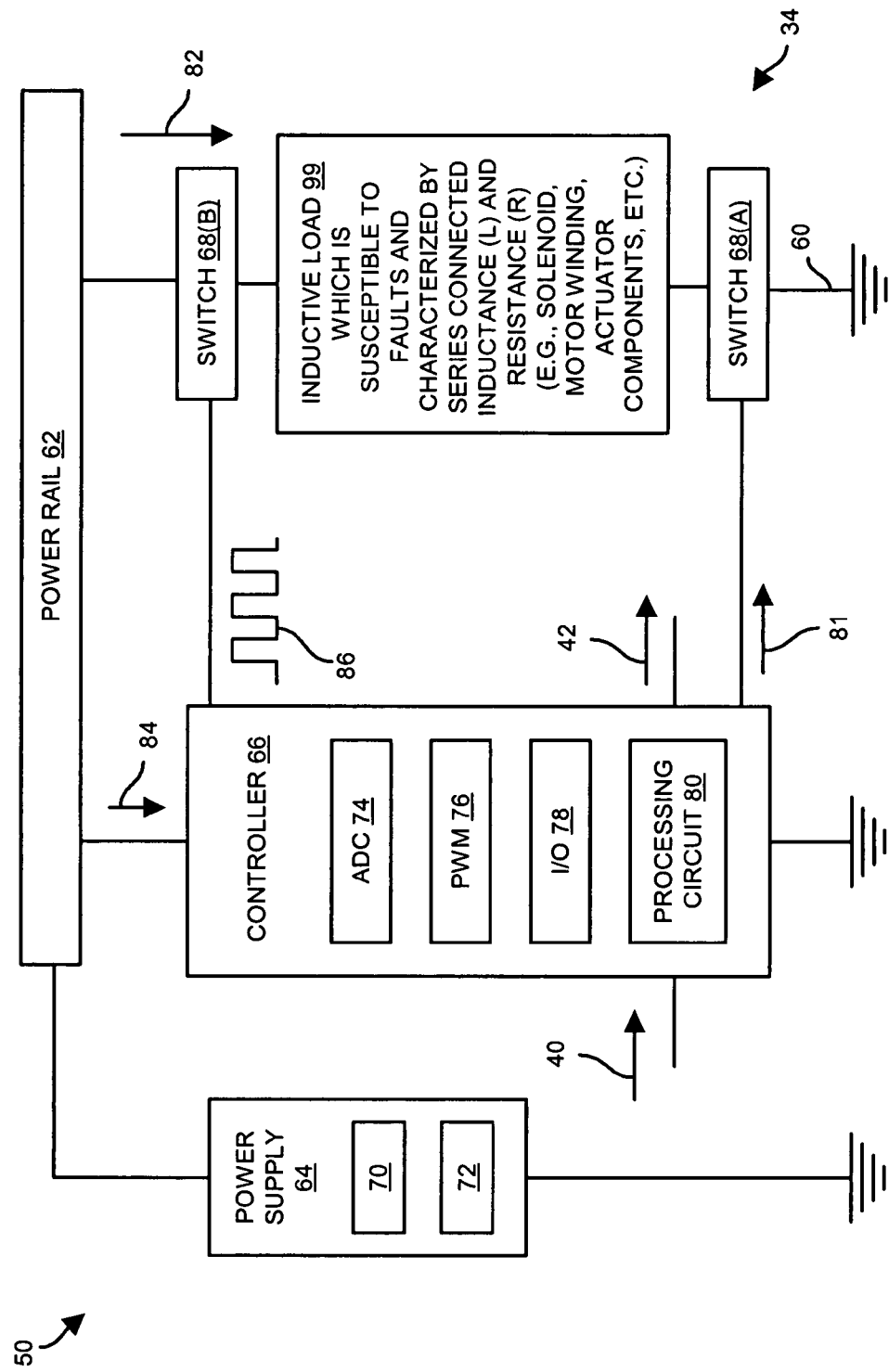
FIG. 2 is a block diagram of a portion of the operating environment of FIG. 1 which carries out testing of the inductive load.

FIG. 2 shows a circuit portion 50 of the operating environment 20 which carries out testing of an inductive load 36. As shown in FIG. 2, the circuit portion 50 includes a ground reference 60, a power rail 62, a power supply 64, a controller 66, and a set of switches 68(A), 68(B) (collectively, switches 68). The power supply 64 is disposed between the ground reference 60 and the power rail 62, and includes a power source 70 and a capacitor 72. The controller 66 is disposed between the ground reference 60 and the power rail 62, and includes an analog-to-digital converter 74, a pulse width modulator 76, an input/output (I/O) interface 78, and a processing circuit 80. The switch 68(A) is interconnected between the inductive load 36 and the ground reference 60. The switch 68(B) is interconnected between the inductive load 36 and the power rail 62.

It should be understood that, although the switch 68(A) is shown as simply controlling connectivity between the inductive load 36 and the ground reference 60, the switch 68(A) is intended to represent switching circuitry (or a set of switches) which is involved in isolating the inductive load 36 from other circuitry which is capable of interfering with testing of the inductive load 36, i.e., adjacent circuitry within the device under test 26 such as the steering circuitry 38 which controls steering of the DUT 26 (also see FIG. 1). The switch 68(A) is also intended to represent switching circuitry which properly connects the inductive load 36 to the test circuitry 34 for testing. The controller 66 is configured to carry out such configuring by providing control signals 81 to the switch 68(A).

During operation, the controller 66 receives the test command 40 from the command interface 24 (also see FIG. 1). In response to the test command 40, the controller 66 properly connects the inductive load 36 for testing, effectuates application of a modulated test signal 82 to the inductive load 36, and obtains a result signal 84 in response to the application of the modulated test signal 82. The controller 66 generates the response signal 42 based on the result signal 84, and provides the response signal 42 back to the command interface 24. The response signal 42 (e.g., a digital value) indicates whether the inductive load 36 is in (i) a shorted inductive load state, (ii) a normal inductive load state, or (iii) an abnormally high inductive load state.

It should be understood that the controller 66 is capable of being a relatively simple electronic circuit which is dedicated to simply carrying out testing of one inductive load 36. Alternatively, the controller 66 is implemented as a sophisticated control circuit which is capable of carrying out additional operations (e.g., tests of multiple inductive loads 36 via control over a network of switches 68, different types of tests on one or more inductive loads 36, tests on other components within the device, etc.).

By way of example only, FIG. 2 shows how the controller 66 tests only one inductive load for simplicity. As shown, the power source 70 of the power supply 64 provides a rail voltage ($V_R$) between the power rail 62 and the ground reference 60, e.g., a ground rail, chassis ground (also, see the device housing 30 in FIG. 1), etc. The capacitor 70 of the power supply 64 stabilizes the rail voltage ($V_R$) during application of the modulated signal 82 to the inductive load 36. The processing circuitry 80 receives the test command 40 through the I/O interface 78, and directs the pulse width modulator 76 to provide a pulse width modulated control signal 86 to drive the switch 68(B). Accordingly, the switch 68(B) responds to the pulse width modulated control signal 86 by applying the modulated signal 82 to the inductive load 36. The analog-to-digital converter 74 senses, on its input, a voltage from the power rail 62 (i.e., the result signal 84) and provides, on its output, a digital value indicating which state the inductive load is in (i.e., the response signal 42). A copy of this output signal (or an enhanced signal) indicating which state the inductive load is in is then provided from the I/O interface 78 back to the command interface 24 (FIG. 1). Accordingly, the command interface 24 is capable of remotely determining whether the DUT 26 is suitable for launch using the built-in test circuitry 34. Further details will now be provided with reference to FIGS. 3-5.

Figure 3:
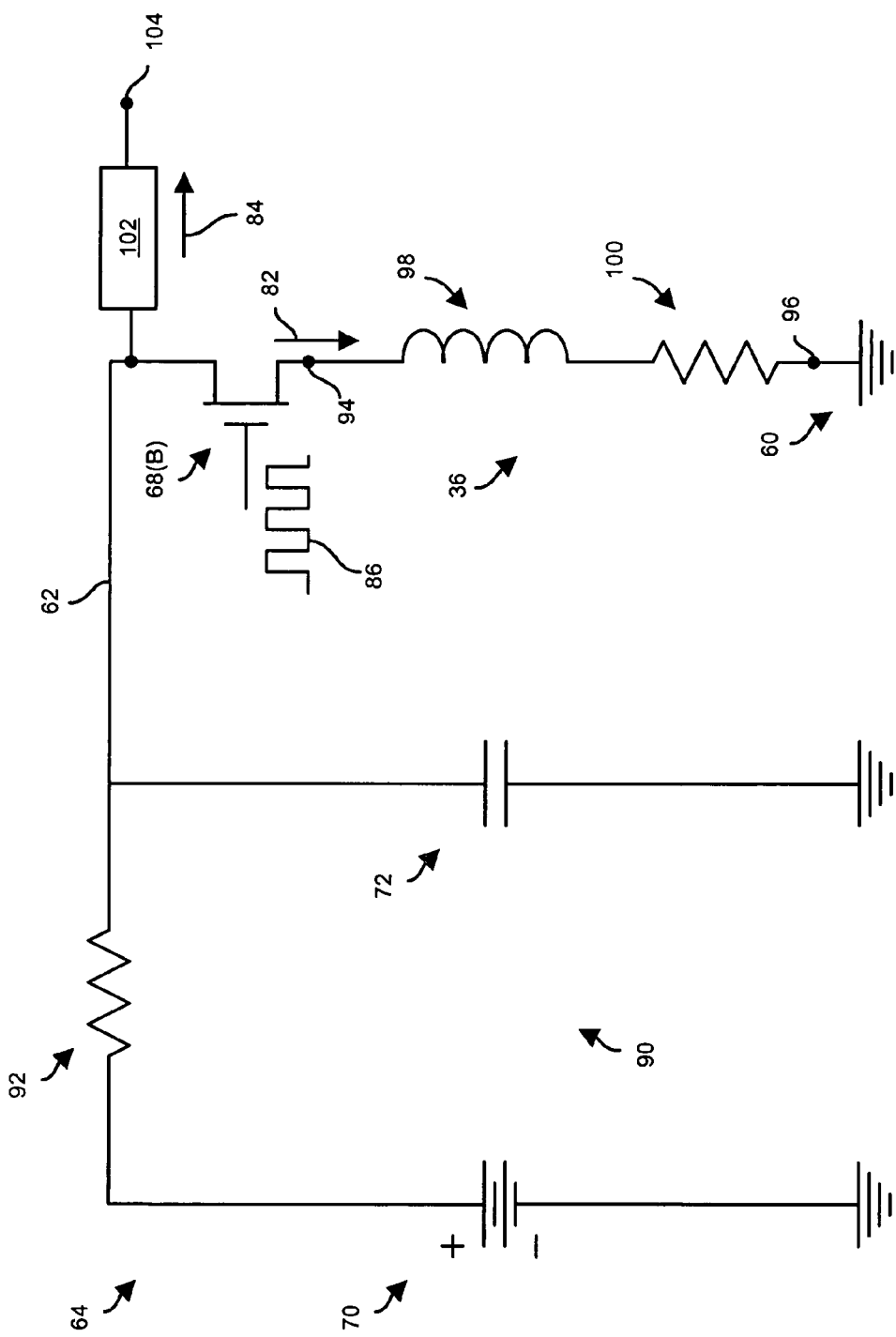
FIG. 3 is a schematic diagram of various components of a portion of the operating environment of FIG. 1 when the inductive load is in a normal inductive load state.
Figure 4:
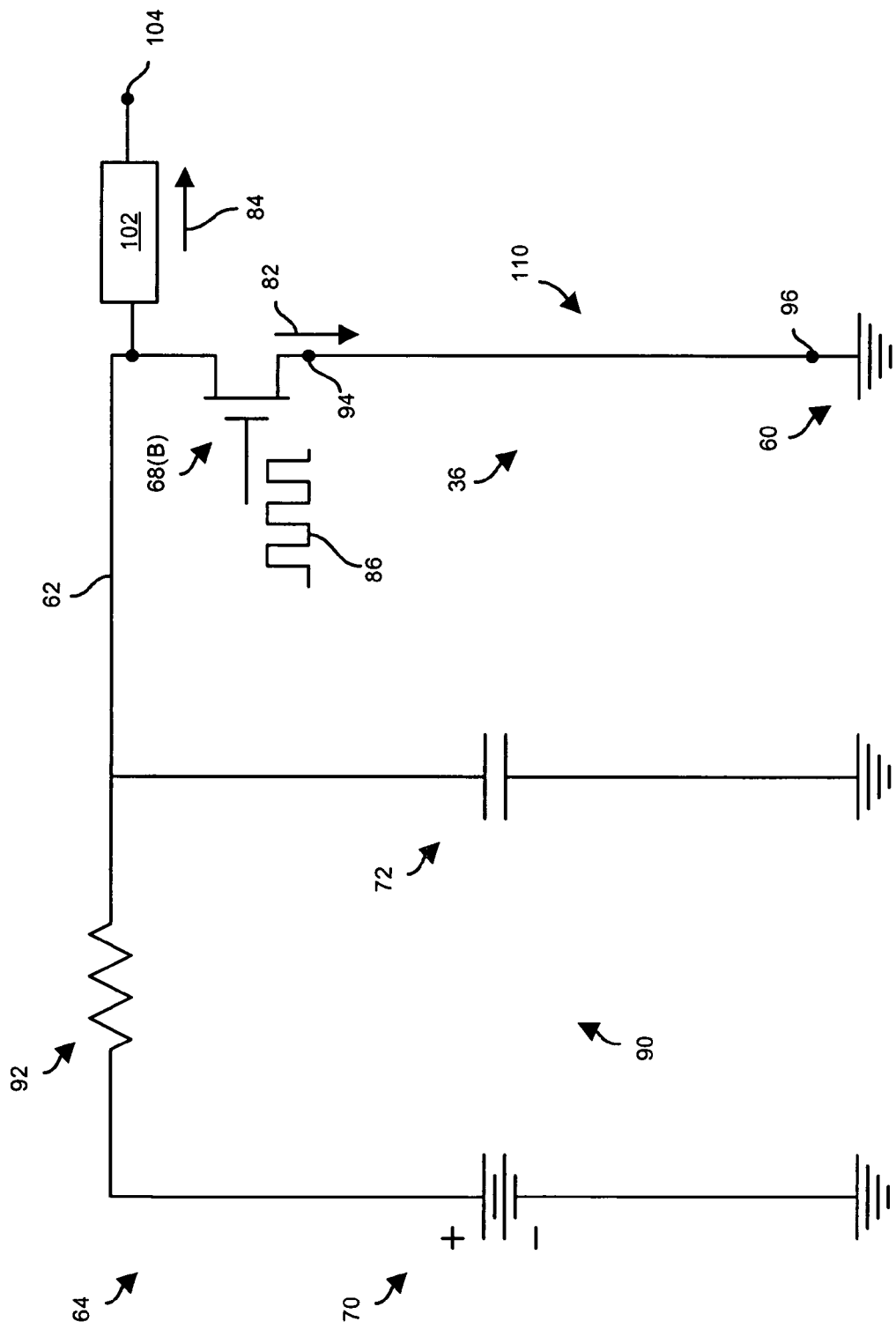
FIG. 4 is a schematic diagram of the various components of the portion of the operating environment of FIG. 1 when the inductive load is in a shorted inductive load state.
Figure 5:
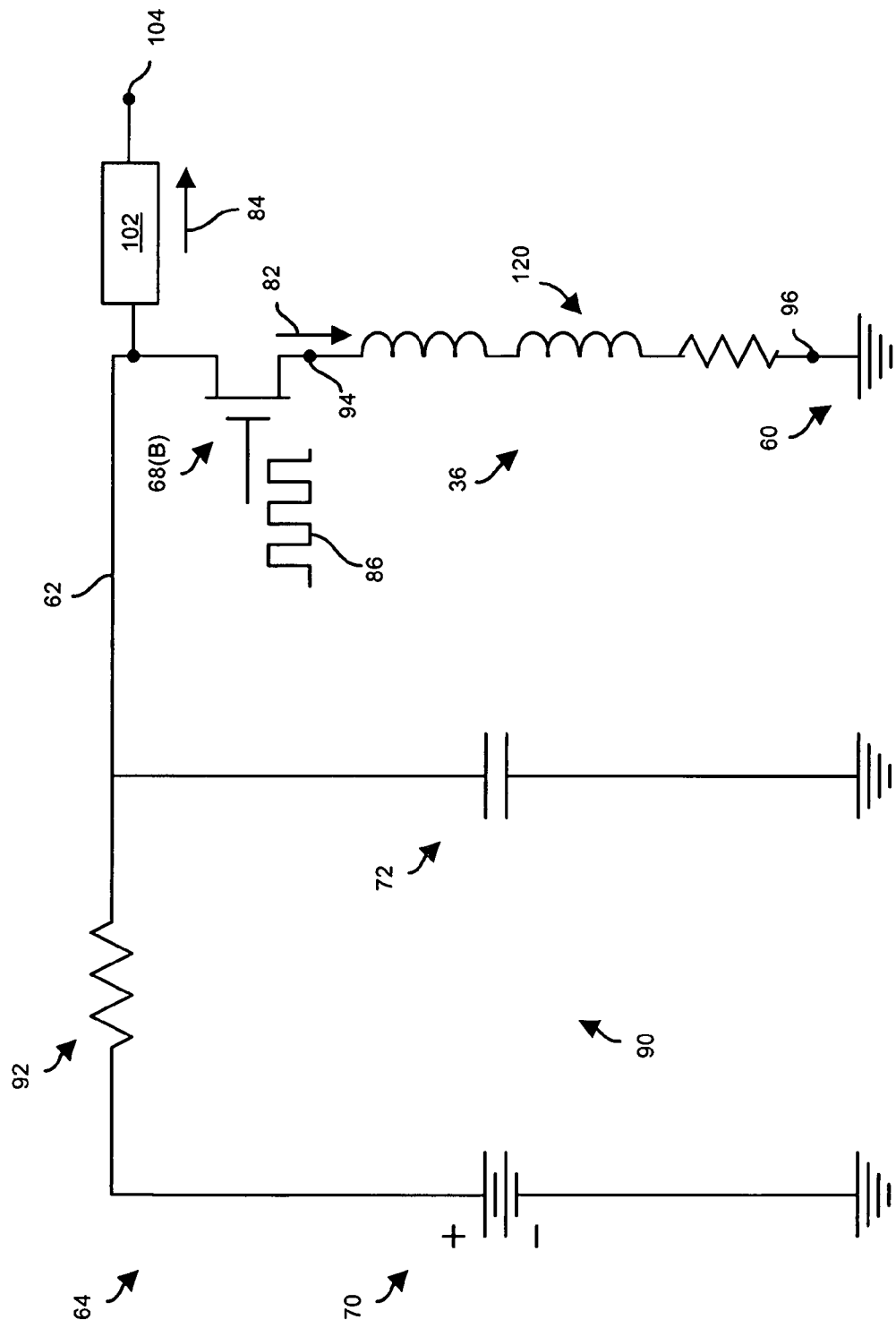
FIG. 5 is a schematic diagram of the various components of the portion of the operating environment of FIG. 1 when the inductive load is in an abnormally high inductive load state.

FIGS. 3-5 show various components of the operating environment 20 depending on the state of an inductive load 36. In particular, FIG. 3 is a schematic diagram illustrating how certain components are connected when the inductive load 36 is in a normal inductive load state. FIG. 4 is a schematic diagram illustrating how the components are connected when the inductive load 36 is in a shorted inductive load state. FIG. 5 is a schematic diagram illustrating how the components are connected when the inductive load 36 is in an abnormally high inductive load state.

As shown in FIG. 3, the power supply 64 is illustrated by the power source 70 in combination with an RC circuit 90, namely, the capacitor 72 and a current limiting resistor 92. The inductive load 36 is disposed between a connection node 94 leading to the switch 68(B) and another connection node 96 leading to the ground reference 60 through the switch 68(A) which is shown in FIG. 2 but omitted from FIG. 3 for simplicity. Here, the inductive load 36 is shown in a normal inductive load state, i.e., the inductive load 36 is properly characterized by an inductor 98 having a normal inductance value (L_param) and a resistor 100 having a normal resistance value (R_param) connected in series between the connection nodes 94, 96.

During testing, the RC circuit 90 operates to stabilize the rail voltage ($V_R$). The switch 68(B), which is illustrated generally as a FET transistor driven by the pulse width modulated control signal 86 from the pulse width modulator 76 of the controller 66 (also see FIG. 2), applies the modulated signal 82 to the inductive load 36. The result signal 84 is then obtained by the controller 66 directly from the power rail 62 or indirectly through a scaling block 102 at a node 104. The scaling block 102 is a circuit capable of translating a wide voltage range (e.g., 0 to 100 Volts) to a smaller range (e.g., 0 to 5 Volts) which is more suitable for measurement.

FIG. 4 shows the inductive load 36 in a shorted inductive load state, i.e., the inductive load 36 is characterized by a direct electrical pathway 110 having little or no inductance and/or little or no resistance between the two connection nodes 94, 96. For example, in the context of a motor, a defect in may exist in the motor winding which allows current to substantially circumvent a substantial portion of the winding. As another example, the motor winding may be improperly installed in a manner that provides a short which circumvents the motor winding altogether. Since there is continuity through the inductive load 36, a conventional continuity test would not detect this defect.

Nevertheless, it should be clear that the result signal 84 obtained from the circuit in FIG. 4 would clearly be different than the result signal 84 obtained in FIG. 3. In particular, the measured voltage at the power rail 62 (or the measured voltage at the node 104) in FIG. 4 would be significantly lower than the measured voltage at the power rail 62 (or the node 104) in FIG. 3 due to the shorted electrical pathway 110 in FIG. 4. Accordingly, the controller 66, which includes the analog-to-digital converter 74 would be able to distinguish the shorted inductive load state of FIG. 4 from the normal inductive load state of FIG. 3.

FIG. 5 shows the inductive load 36 in an abnormally high inductive load state, i.e., the inductive load 36 is characterized by a very high inductance 120. For example, in the context of a motor, a defect in may exist in the motor winding such as an improperly manufactured or installed motor. Again, since there is continuity through the inductive load 36, a conventional continuity test would not detect the defect.

However, it should be clear that the result signal 84 obtained from the circuit in FIG. 5 would clearly be different than the result signal 84 obtained in FIG. 3 or 4. In particular, the measured voltages at the power rail 62 or at the node 104 in FIG. 5 would be significantly higher than the measured voltages at the power rail 62 or at the node 104 in FIG. 3 or FIG. 4 due to the higher inductance in FIG. 5. As a result, the controller 66, which includes the analog-to-digital converter 74, would be able to distinguish the abnormally high inductive load state of FIG. 5 from the other inductive load states of FIGS. 3 and 4. Further details will now be provided with reference to FIG. 6.

Figure 6:
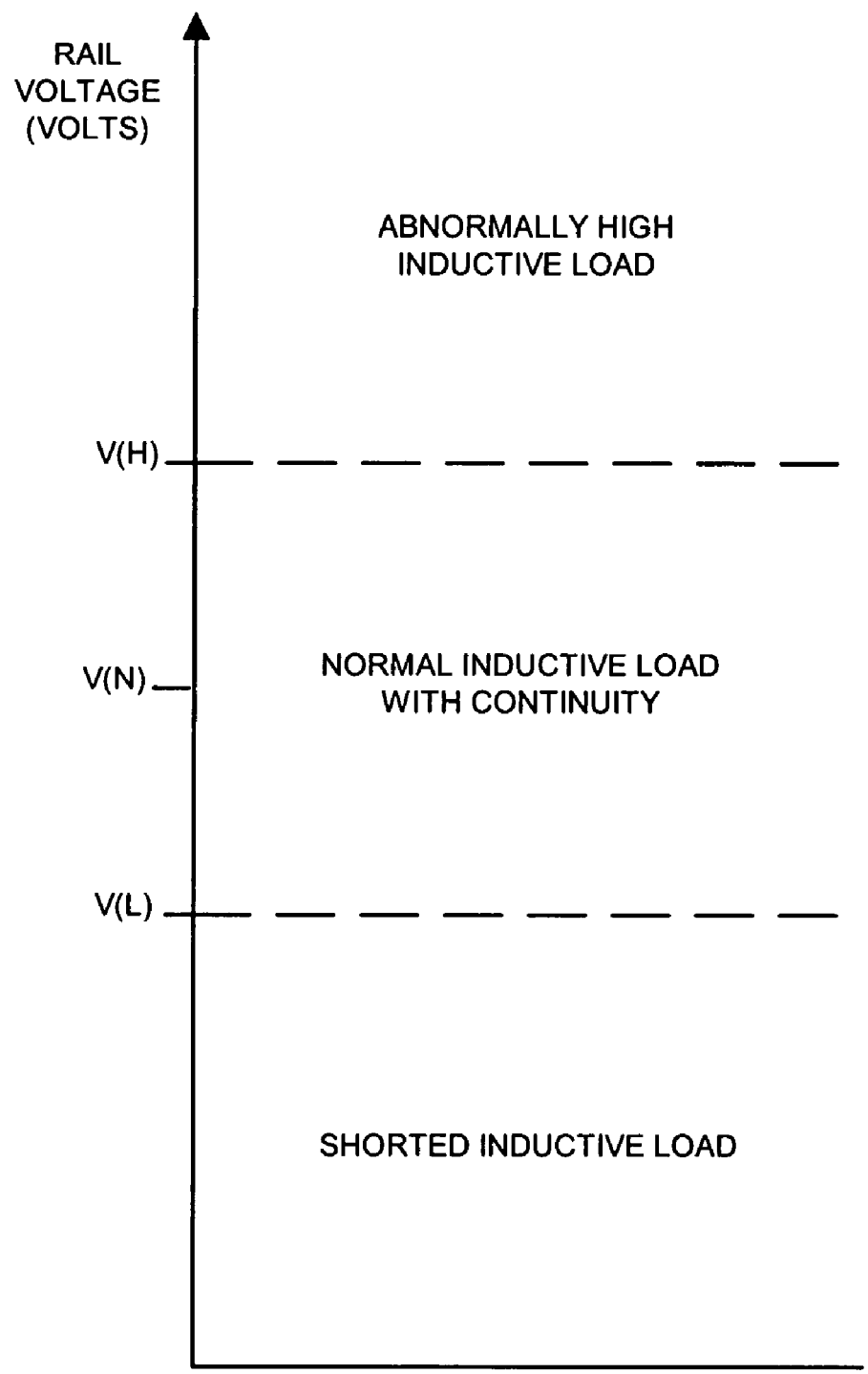
FIG. 6 is a plot of a result signal which is obtained in response to the application of the modulated signal.

FIG. 6 is a plot of the result signal 84 which is obtained in response to the application of the modulated signal 82 to the inductive load 36. Recall that the switch 68(B) (FIG. 2) applies the modulated signal 82 to the inductive load 36 in response to the pulse width modulated control signal 86 from the controller 66.

It should be understood that the pulse width modulated control signal 86 has a predefined duty cycle and a predefined modulating frequency which is preferably set to enable the analog-to-digital converter 74 to sense a wide range of voltages from the power rail 62 and thus easily distinguish which state the inductive load 36 is in. In some arrangements, the rail voltage ($V_R$) is in the range of 3 to 120 Volts (e.g., 3.3V, 5V, 15V, 28V, 100V), the predefined duty cycle is in the range of 30-70% (e.g., 50%), and the predefined frequency is in the range of 1 KHz to 200 KHz (e.g., 20 KHz). These particular values may vary depending on different characteristics (e.g., different inductance values (L) and different resistance values (R)) of the inductive load 36 under test (e.g., different motor windings).

It should be further understood that, for each specific implementation, there is a predetermined nominal value for the result signal 84, i.e., an expected sensed voltage V(N), if the inductive load 36 is not defective and if the inductive load 36 is installed properly. Accordingly, a normal operating range around this nominal value is capable of being established, i.e., a range between V(H) and V(L) (e.g., +/−1% of V(N), +/−3%, +/−5%, +/−10%, etc.). V(H) represents the upper voltage threshold where, when measuring the result signal 84, a sensed voltage that is higher than V(H) results in a determination that the inductive load 36 has an abnormally high inductive load state. Similarly, V(L) represents the lower voltage threshold where, when measuring the result signal 84, a sensed voltage that is lower than V(L) results in a determination that the inductive load 36 has a shorted inductive load state. The range between V(H) and V(L) is capable of being non-symmetrical around the nominal value V(N). Nevertheless, if the result signal 84 is outside this range, the state of the inductive load 36 is deemed to be unacceptable.

Additionally, it should be understood that the test circuitry 34 is capable of detecting an open circuit state. This situation could exist if there were a break in a motor coil, or if the inductive load were improperly installed. In these situations, the voltage of the result signal 84 would exceed the higher voltage threshold V(H).

Furthermore, it should be understood that, although these components are described as formed part of the built-in test circuitry 34, these components may also form part of other sub-systems or assemblies of the device under test 26. For example, the ground reference 60, the power rail 62 and the power supply 62 may also form a portion of an electronic guidance system involved in steering the device during and after deployment.

Figure 7:
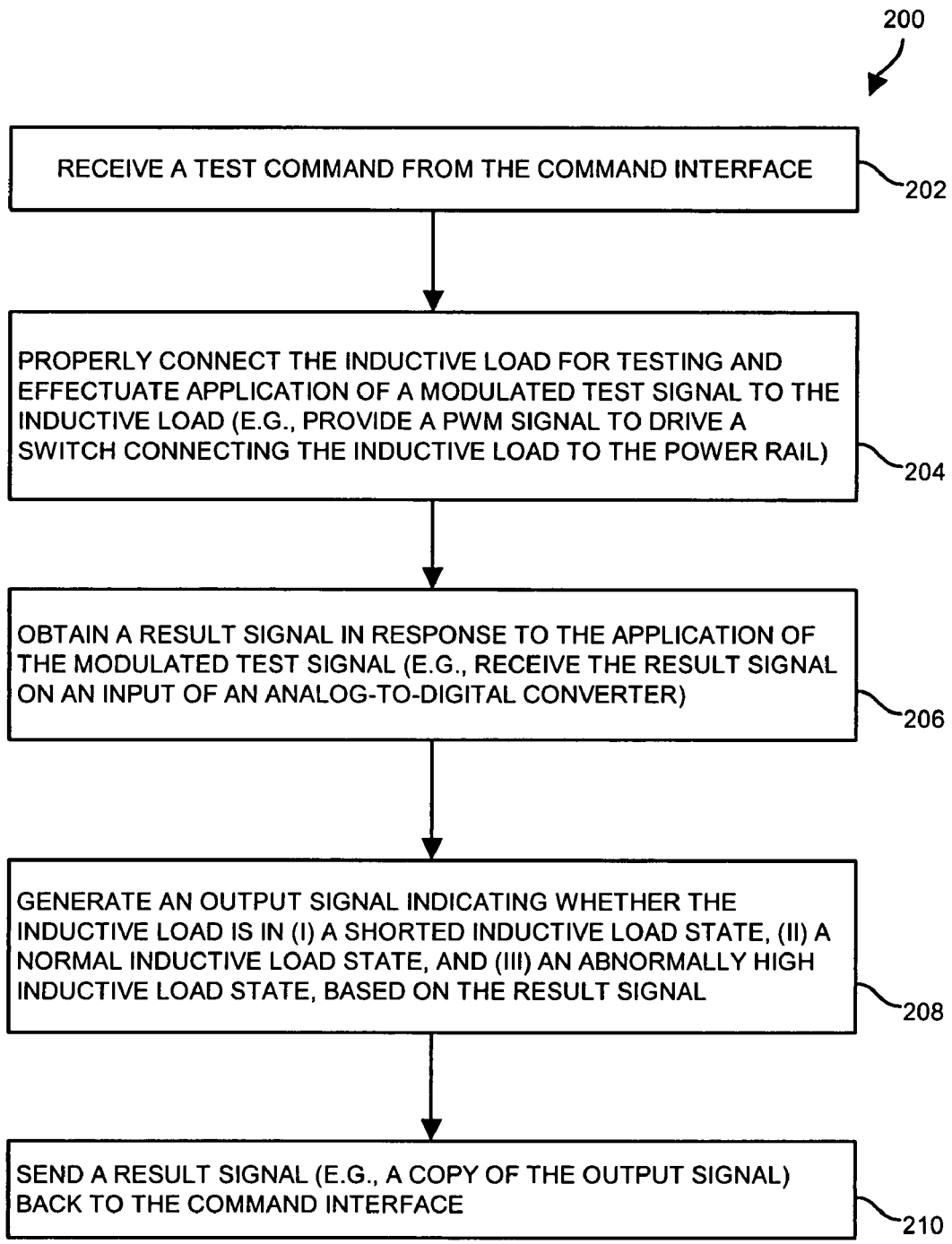
FIG. 7 is a flowchart of a procedure carried out by a controller of the operating environment of FIG. 1.

FIG. 7 is a flowchart of a procedure 200 carried out by the controller 66 of FIG. 2 during testing of the inductive load 36. In step 202, the controller 66 receives a test command 40 from the command interface 24. In the context of a guidable projectile deployment system, such a command 40 can be provided by the command interface 24 just prior deployment (e.g., during a weapon arming phase).

In step 204, the controller 66 effectuates application of the modulated test signal 82 to the inductive load 36. In some arrangements, the controller 66 provides a pulse width modulated control signal 86 to the switch 68(B), also see FIG. 2. It should be understood that other mechanisms are suitable for creating the modulated test signal 82 such as circuitry which outputs a sinusoidal signal, or an oscillating signal generated from a digital circuit, analog electronics, etc.

In step 206, the controller 66 obtains the result signal 84 in response to the application of the modulated test signal 82 to the inductive load 36. The input of an analog-to-digital converter is particularly well-suited for obtaining the result signal 84.

In step 208, the controller 66 generates an output signal which indicates whether the inductive load 36 is in (i) a shorted inductive load state, (ii) a normal inductive load state, or (iii) an abnormally high inductive load state. For the analog-to-digital converter 74 (FIG. 2), a digital value is generated which is based on the voltage of the result signal 84. In other arrangements, the response signal 42 is generated in a different manner and/or takes a different form, e.g., separately asserted/de-asserted lines, multiple voltages, etc.

In step 210, the controller 66 provides the response signal 42 back to the command interface 24. The response signal 42 can be a copy of the output signal generated in step 208. Alternatively, the response signal 42 can be a more sophisticated signal which includes additional data. Furthermore, in some situations, the controller 66 is capable of analyzing the result signal 84 and performing additional testing prior to providing the response signal 42 containing comprehensive test data back to the command interface 24. In the context of the guidable projectile deployment system, the command interface 42 is capable of disabling deployment of the guidable projectile if the response signal 42 indicates a defect in one or more inductive loads 36 of the guidable projectile.

As described above, an improved test technique involves testing an inductive load 36 of a device 26 such as a guidable projectile using a modulated signal (e.g. an alternating current applied to the inductive load 36). Accordingly, the improved test technique is capable of identifying deviations of the inductive load 36 from a nominal value V(N) (i.e., short, higher or lower inductance). Thus, the improved test technique is capable of detecting the existence of a defective coil or coil installation that would go undetected under a conventional continuity test.

While various embodiments of the invention have been particularly shown and described, it will be understood by those skilled in the art that various changes in form and details may be made therein without departing from the spirit and scope of the invention as defined by the appended claims.

For example, the operating environment 20 was described above as being that of a guidable projectile deployment system which deploys guidable projectiles having motor windings involved in steering the guidable projectiles by way of example only. It should be understood that the operating environment 20 is well-suited for other situations as well. For instance, it is not necessary for the DUT 26 to include the steering circuitry 38 and it is not necessary for the DUT 26 to be a guidable projectile. Other inductive load applications are suitable as well. In particular, the above-described techniques are suitable for testing essentially any inductive load such as circuitry including solenoids, coils, actuators, etc. Moreover, such techniques are suitable for a variety of applications such as robotics, vehicular control, steering mechanisms of aircrafts and/or watercrafts, electromagnetic applications, and remote control applications, among others.

Additionally, the above-described operating environment 20 was explained using positive voltages. The operating environment 20 is capable of being implemented in a similar manner using negative voltages. In such a situation, the plot of FIG. 6 would then be reversed.

Furthermore, it should be understood that the controller 66 was described above as being capable of distinguishing when the inductive load 36 is in (i) a shorted inductive load state, (ii) a normal inductive load state, (iii) an abnormally high inductive load state, or (iv) an open state. There is no requirement that the controller 66 be equipped to distinguish each of these four states using the application of the modulated signal 82. Rather, the controller 66 may be configured to simply distinguish between a subset of these states (e.g., distinguish between at least two states) such as between a shorted inductive load state and a normal inductive load state. The controller 66 may also work to carry out additional tests in combination the inductive load testing. For example, the controller 66 may carry out as an additional continuity test. Such modifications and enhancements are intended to belong to various embodiments of the invention.

What is claimed is:

1. A method for testing an inductive load of a device, the method comprising:
    effectuating application of a modulated test signal, by test circuitry, to the inductive load of the device;
    obtaining a result signal, by the test circuitry, in response to the application of the modulated test signal to the inductive load of the device; and
    based on the result signal, generating, by the test circuitry, an output signal indicating that the inductive load of the device is in one of (i) a shorted inductive load state, (ii) a normal inductive load state, and (iii) an abnormally high inductive load state;
wherein the device is a guidable projectile; and
wherein the method further comprises enabling, by the test circuitry, launch of the guidable projectile when the output signal indicates that the inductive load of the device is in the normal inductive load state, and disabling launch of the guidable projectile when the output indicates that the inductive load is in either of (i) the shorted inductive load state, and (ii) the abnormally high inductive load state.

2. A method as in claim 1
wherein the inductive load is a motor winding involved in steering the guidable projectile while the guidable projectile is in flight; and
wherein effectuating application of the modulated test signal to the inductive load of the device includes driving a switching circuit, which is disposed between the motor winding and a power rail, with a pulse width modulated control signal to apply the modulated test signal from the power rail to the motor winding involved in steering the guidable projectile.

3. A method as in claim 1 wherein obtaining the result signal includes acquiring, as the result signal, (i) a first voltage when the inductive load is in the shorted inductive load state, (ii) a second voltage when the inductive load is in the normal inductive load state, and (iii) a third voltage when the inductive load is the abnormally high inductive load state;
wherein the absolute value of the second voltage is greater than the absolute value of the first voltage; and
wherein the absolute value of the third voltage is greater than the absolute value of the second voltage.

4. A method as in claim 1 wherein the test circuitry resides within the guidable projectile; and wherein the method further comprises:
receiving a command from a command interface of a guidable projectile deployment system, the command being constructed and arranged to direct the test circuitry to apply the modulated test signal to the inductive load of the device.

5. A device, comprising:
a device housing;
an inductive load disposed within the device housing;
test circuitry disposed within the device housing, the test circuitry being constructed and arranged to:
effectuate application of a modulated test signal to the inductive load,
obtain a result signal in response to the application of the modulated test signal to the inductive load, and
generate an output signal indicating that the inductive load is in one of (i) a shorted inductive load state, (ii) a normal inductive load state, and (iii) an abnormally high inductive load state, based on the result signal;
wherein the device is a guidable projectile; and
wherein the test circuitry is further constructed and arranged to enable launch of the guidable projectile when the output signal indicates that the inductive load is in the normal inductive load state, and disable launch of the guidable projectile when the output indicates that the inductive load is in either of (i) the shorted inductive load state, and (ii) the abnormally high inductive load state.

6. A device as in claim 5 wherein the test circuitry, when obtaining the result signal, is constructed and arranged to acquire, as the result signal, (i) a first voltage when the inductive load is in the shorted inductive load state, (ii) a second voltage when the inductive load is in the normal inductive load state, and (iii) a third voltage when the inductive load is the abnormally high inductive load state;
wherein the absolute value of the second voltage is greater than the absolute value of the first voltage; and
wherein the absolute value of the third voltage is greater than the absolute value of the second voltage.

7. A device, comprising:
a device housing;
an inductive load disposed within the device housing;
test circuitry disposed within the device housing, the test circuitry being constructed and arranged to:
effectuate application of a modulated test signal to the inductive load,
obtain a result signal in response to the application of the modulated test signal to the inductive load, and
generate an output signal indicating that the inductive load is in one of (i) a shorted inductive load state, (ii) a normal inductive load state, and (iii) an abnormally high inductive load state, based on the result signal;
wherein the device is a guidable projectile;
wherein the inductive load is a motor winding involved in steering the guidable projectile while the guidable projectile is in flight; and
wherein the test circuitry includes a switching circuit and a controller, the switching circuit being disposed between the motor winding and a power rail, the controller being constructed and arranged to drive the switching circuit with a pulse width modulated control signal to direct the switching circuit to apply the modulated test signal from the power rail to the motor winding involved in steering the guidable projectile.

8. A device as in claim 7 wherein the controller of the test circuitry includes a pulse width modulator which is constructed and arranged to provide the pulse width modulated control signal with a predefined duty cycle and a predefined modulating frequency.

9. A device as in claim 8, further comprising
a capacitor which is constructed and arranged to stabilize a rail voltage between the power rail and a ground reference during application of the modulated test signal from the power rail to the motor winding involved in steering the guidable projectile.

10. A device as in claim 8 wherein the controller of the test circuitry further includes an analog-to-digital converter having (i) an input which is constructed and arranged to obtain the result signal by inputting an analog signal from the power rail, and (ii) an output which is constructed and arranged to provide the output signal by outputting a digital value indicating which state the inductive load is in.

11. A device as in claim 10, further comprising:
steering circuitry which is constructed and arranged to steer the guidable projectile housing while the guidable projectile housing is in flight; and
wherein the test circuitry further includes switching circuitry which is constructed and arranged to isolate the motor winding from the steering circuitry while the analog-to-digital converter outputs the digital value indicating which state the inductive load is in.

12. A device as in claim 7 wherein the device is a guidable projectile; and
wherein the test circuitry is further constructed and arranged to enable launch of the guidable projectile when the output signal indicates that the inductive load is in the normal inductive load state, and disable launch of the guidable projectile when the output indicates that the inductive load is in either of (i) the shorted inductive load state, and (ii) the abnormally high inductive load state.

13. A guidable projectile deployment system, comprising:
a support platform;
a command interface supported by the support platform; and
a guidable projectile supported by the support platform, the guidable projectile having a housing, an inductive load disposed within the housing, and test circuitry disposed within the housing, the test circuitry being constructed and arranged to:
  effectuate application of a modulated test signal to the inductive load in response to a command from the command interface,
  obtain a result signal in response to the application of the modulated test signal to the inductive load, and
  generate an output signal and provide the output signal to the command interface, the output signal indicating that the inductive load is in one of (i) a shorted inductive load state, (ii) a normal inductive load state, and (iii) an abnormally high inductive load state, based on the result signal.

14. A guidable projectile deployment system as in claim 13 wherein the inductive load is a motor winding involved in steering the guidable projectile while the guidable projectile is in flight; and
  wherein the test circuitry includes a switching circuit and a controller, the switching circuit being disposed between the motor winding and a power rail, the controller being constructed and arranged to drive the switching circuit with a pulse width modulated control signal to direct the switching circuit to apply the modulated test signal from the power rail to the motor winding involved in steering the guidable projectile.

15. A guidable projectile deployment system as in claim 14 wherein the controller of the test circuitry includes a pulse width modulator which is constructed and arranged to provide the pulse width modulated control signal with a predefined duty cycle and a predefined modulating frequency.

16. A guidable projectile deployment system as in claim 15, further comprising:
  a capacitor which is constructed and arranged to stabilize a rail voltage between the power rail and a ground reference during application of the modulated test signal from the power rail to the motor winding involved in steering the guidable projectile.

17. A guidable projectile deployment system as in claim 15 wherein the controller of the test circuitry further includes an analog-to-digital converter having (i) an input which is constructed and arranged to obtain the result signal by measuring a voltage from the power rail, and (ii) an output which is constructed and arranged to provide the output signal by outputting a digital value indicating which state the inductive load is in.

18. A guidable projectile deployment system as in claim 17, further comprising:
  steering circuitry which is constructed and arranged to steer the guidable projectile housing while the guidable projectile housing is in flight; and
  wherein the test circuitry further includes switching circuitry which is constructed and arranged to isolate the motor winding from the steering circuitry while the analog-to-digital converter outputs the digital value indicating which state the inductive load is in.

19. A guidable projectile deployment system as in claim 13 wherein the test circuitry is further constructed and arranged to enable launch of the guidable projectile when the output signal indicates that the inductive load is in the normal inductive load state, and disable launch of the guidable projectile when the output indicates that the inductive load is in either of (i) the shorted inductive load state, and (ii) the abnormally high inductive load state.

20. A guidable projectile deployment system as in claim 13 wherein the test circuitry, when obtaining the result signal, is constructed and arranged to acquire, as the result signal, (i) a first voltage when the inductive load is in the shorted inductive load state, (ii) a second voltage when the inductive load is in the normal inductive load state, and (iii) a third voltage when the inductive load is the abnormally high inductive load state;
  wherein the absolute value of the second voltage is greater than the absolute value of the first voltage; and
  wherein the absolute value of the third voltage is greater than the absolute value of the second.

* * * * *